United States Patent
Cho et al.

(10) Patent No.: US 9,502,257 B2
(45) Date of Patent: Nov. 22, 2016

(54) NON-VOLATILE MEMORY DEVICE HAVING ASYMMETRICAL CONTROL GATES SURROUNDING A FLOATING GATE AND MANUFACTURING METHOD THEREOF

(71) Applicant: MagnaChip Semiconductor, Ltd., Cheongju-si (KR)

(72) Inventors: Jeong Ho Cho, Gyeonggi-do (KR); Se Woon Kim, Cheongju-si (KR); Kyung Min Kim, Cheongju-si (KR); Jung Goo Park, Daejeon-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/337,418

(22) Filed: Jul. 22, 2014

(65) Prior Publication Data

US 2015/0311299 A1 Oct. 29, 2015

(30) Foreign Application Priority Data

Apr. 23, 2014 (KR) .................. 10-2014-0048451

(51) Int. Cl.
| | |
|---|---|
| *H01L 29/66* | (2006.01) |
| *H01L 21/28* | (2006.01) |
| *H01L 29/423* | (2006.01) |
| *H01L 29/788* | (2006.01) |
| *H01L 27/115* | (2006.01) |

(52) U.S. Cl.
CPC ... *H01L 21/28273* (2013.01); *H01L 27/11534* (2013.01); *H01L 29/42324* (2013.01); *H01L 29/7881* (2013.01)

(58) Field of Classification Search
CPC ................... H01L 27/11517; H01L 21/28273; H01L 25/0657; H01L 25/50; H01L 27/11534; H01L 29/42324; H01L 29/7881; G11C 16/0433

USPC ........................................... 257/319; 438/593
See application file for complete search history.

(56) References Cited

U.S. PATENT DOCUMENTS

| | | | |
|---|---|---|---|
| 6,451,652 B1 | 9/2002 | Caywood et al. | |
| 2002/0142545 A1* | 10/2002 | Lin ................... | H01L 27/11521 438/257 |
| 2004/0043563 A1* | 3/2004 | Lin ................... | H01L 27/11521 438/257 |
| 2005/0026371 A1* | 2/2005 | Forbes .............. | H01L 21/28273 438/266 |
| 2006/0202255 A1* | 9/2006 | Jeon .................. | H01L 21/28273 257/315 |
| 2009/0250742 A1* | 10/2009 | Kinoshita ......... | H01L 21/28273 257/319 |
| 2010/0270605 A1* | 10/2010 | Choi ................. | H01L 21/28273 257/316 |

* cited by examiner

*Primary Examiner* — Duy T Nguyen

(57) ABSTRACT

A non-volatile memory device and a method of manufacturing the non-volatile memory device, where the non-volatile memory device includes a floating gate insulating layer and a floating gate disposed on a substrate, a dielectric layer formed perpendicular to the floating gate insulating layer and at two sides of the floating gate, and a first control gate at a first side of the dielectric layer distal from the floating gate and a second control gate at a second side of the dielectric layer distal from the floating gate, wherein the first control gate and the second control gate are connected to each other, and a second width of the second control gate is wider than a first width of the first control gate. A length of a control gate of a non-volatile memory device may be extended to effectively preventing the generation of leakage current when a control gate is off.

26 Claims, 7 Drawing Sheets

NON-VOLATILE MEMORY DEVICE HAVING ASYMMETRICAL CONTROL GATES SURROUNDING A FLOATING GATE AND MANUFACTURING METHOD THEREOF

CROSS-REFERENCE TO RELATED APPLICATION

This application claims priority under 35 U.S.C. §119 of Korean Patent Application No. 10-2014-0048451 filed on Apr. 23, 2014, in the Korean Intellectual Property Office, the entire disclosure of which is incorporated herein by reference for all purposes.

BACKGROUND

1. Field

The following description relates to a non-volatile memory device and a manufacturing method thereof. The following description concerns a non-volatile memory device capable of effectively preventing the generation of leakage current when a control gate is off, in a manner that employs a structure in which a length of the control gate is extended, and a manufacturing method thereof.

2. Description of Related Art

According to the conventional method, using a height of a floating gate, a control gate of an Electrically Erasable Programmable Read-Only Memory (EEPROM) is manufactured by etching-back a poly layer to form the control gate in the form of spacer. As conventionally manufactured EEPROM cell are used in various products, there is a need to reduce a leakage current in particular at a high temperature motion.

In order to reduce the leakage current that is generated in the EEPROM cell, it is required that a length of the control gate is extended. Since a length of the control gate is determined according to a thickness of the poly layer to form the control gate, so it is difficult to extend a length of the control gate, unless a thickness of poly layer is changed. According to the conventional method, it is difficult to extend a length of a control gate, because a control gate is formed by means of the etch-back.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a non-volatile memory device, the device including a floating gate insulating layer and a floating gate disposed on a substrate, a dielectric layer formed perpendicular to the floating gate insulating layer and at two sides of the floating gate, and a first control gate at a first side of the dielectric layer distal from the floating gate and a second control gate at a second side of the dielectric layer distal from the floating gate, wherein the first control gate and the second control gate are connected to each other, and a second width of the second control gate is wider than a first width of the first control gate.

The non-volatile memory device may include a first control gate insulating layer formed between the substrate and the first control gate, and a second control gate insulating layer formed between the substrate and the second control gate, wherein the second control gate insulating layer extends further than the first control gate insulating layer.

The second width may not be less than 1.5 times and may not be more than 3.5 times a width of the floating gate.

The non-volatile memory device may include a source region proximal to the first control gate, and a drain region proximal to the second control gate.

The non-volatile memory device may include a third control gate extending toward a side of the first or the second control gates.

A width of the third control gate may be narrower than a sum of the width of the first and the second control gates.

The non-volatile memory device may include a contact plug formed on the third control gate.

In another general aspect, there is provided a manufacturing method of a non-volatile memory device, the method including forming a floating gate insulating layer and a floating gate disposed on a substrate, forming a dielectric layer perpendicular to the floating gate insulating layer and at two sides of the floating gate, forming a control gate insulating layer on the substrate, forming a conductive layer on the dielectric layer and the control gate insulating layer, forming a control gate pattern at a portion of the conductive layer, etching-back the control gate using the control gate pattern as a mask, and forming a first control gate at a first side of the dielectric layer distal from the floating gate and a second control gate at a second side of the dielectric layer distal from the floating gate, wherein the first control gate and the second control gate are connected to each other and a second width of the second control gate is wider than a first width of the first control gate.

The control gate insulating layer may include a first control gate insulating layer formed between the substrate and the first control gate, and a second control gate insulating layer formed between the substrate and the second control gate, wherein the second control gate insulating layer is formed to extend further than the first control gate insulating layer.

A width of the second control gate may not be less than 1.5 times and may not be more than 3.5 times a width of the floating gate.

A length of the control gate may be controlled by controlling a width of the control gate pattern.

The etching-back of the control gate may include forming a third control gate extending toward a side of the first or the second control gates.

The manufacturing method may include forming a contact plug on the third control gate.

In another general aspect, there is provided a non-volatile memory device, the device including a floating gate insulating layer and a floating gate disposed on a substrate, a dielectric layer formed at two vertical sides of the floating gate, and a first control gate positioned adjacent to a first side of the dielectric layer and a second control gate positioned adjacent to a second side of the dielectric layer, wherein the first control gate and the second control gate are connected to each other to surround the floating gate and the widths of the control gates are asymmetrical.

The non-volatile memory device may include a source region disposed adjacent to the first control gate and a drain region disposed adjacent to the second control gate, and a first contact plug supplying voltage to the source region and a second contact plug supplying voltage to the drain region.

The second width may be wider than the first width, and the second width may not be less than 1.5 times and may not be more than 3.5 times a width of the floating gate.

The non-volatile memory device may include a source region disposed adjacent to the first control gate and a drain region disposed adjacent to the second control gate, and a first contact plug supplying voltage to the source region and a second contact plug supplying voltage to the drain region.

The non-volatile memory device may include spacers disposed adjacent to the first control gate and the second control gate and the spacers being distal from the floating gate, and drift regions having low concentration being formed beneath the spacers.

the floating gate may include a conductive layer and a hard mask layer disposed in series on the floating gate insulating layer.

Other features and aspects may be apparent from the following detailed description, the drawings, and the claims.

Figure 1:
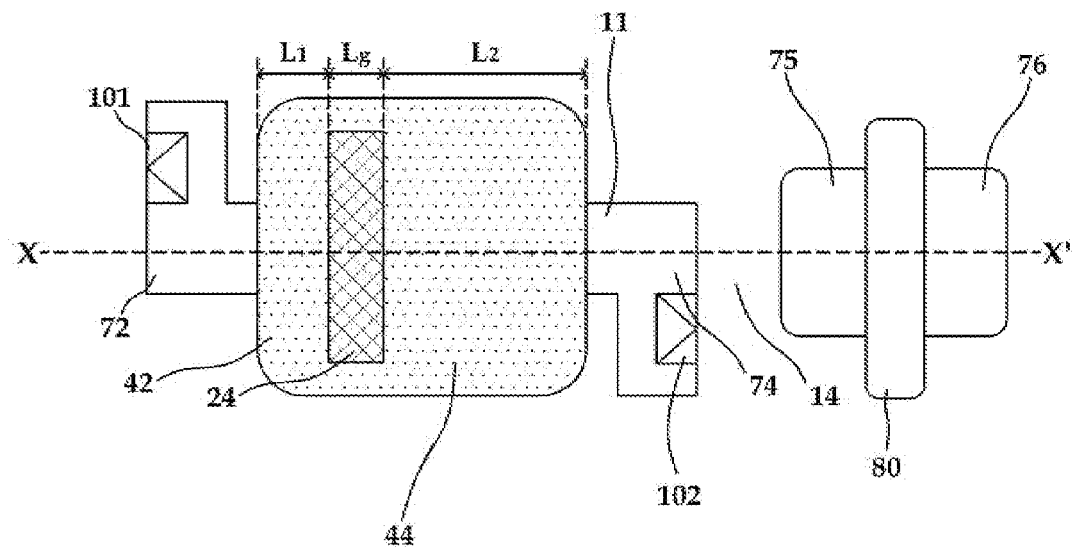
FIG. 1 is a diagram illustrating an example of a non-volatile memory device.

Throughout the drawings and the detailed description, unless otherwise described, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 is a diagram illustrating an example of a non-volatile memory device. Referring now to FIG. 1, in the non-volatile memory device a floating gate 24 exists in an active region 11 and control gates 42 and 44 surround the floating gate 24. A source region 72 and a drain region 74 are disposed in the active region 11. The drain region 74 and source region 72 may be interchangeable. Contact plugs 101 and 102 are disposed in the active region to apply a voltage to a source region 72 and a drain region 74.

A control gate may be divided into a first control gate 42 and a second control gate 44, which are connected with each other physically/electrically. The first control gate 42 has a first width (L1) in a direction of a channel. The second control gate 44 has a second width (L2) in a direction of a channel. The direction of channel may be identified as "a direction of X-X'".

In a non-exhaustive example, the second width (L2) is formed to be much longer than the first width (L1). The second control gate 44 extends longer in a direction of a channel. The control gates 42 and 44 are deemed to have an asymmetrical structure. The asymmetrical structure is such that the lengths of control gates 42, 44, which are formed at both lateral sides of the floating gate 24, differ from each other. A symmetry structure is one where lengths of control gates 42 and 44 are substantially identical. In FIG. 1, the second width (L2) is shown to be much longer than the first width (L1), thus making it possible to reduce a leakage current that flows beneath the second control gate 44.

Lengths of the control gates 42, 44 are designed to be bigger than a width of the floating gate 24. The second width (L2) of the second control gate 44 may not be less than 1.5 times and may not be more than 3.5 times a width (Lg) of the floating gate 24. For example, when a width of a floating gate 24 is about 0.2 um, a length (L1) of a first control gate 42 is about 0.2 um, and a length (L2) of a second control gate 44 is designed to be about 0.4 to 0.6 um. While an extent of a chip is rendered as least as possible, it is possible to reduce the leakage current that flows in the substrate 10 beneath the second control gate 44.

Beside the non-volatile memory device, a logic device is disposed that includes a logic gate 80. High concentration regions 75 and 76 are formed at the sides of the logic gate 80.

The reference numeral 14 that is not described in FIG. 1 denotes an isolation region.

Figure 2:
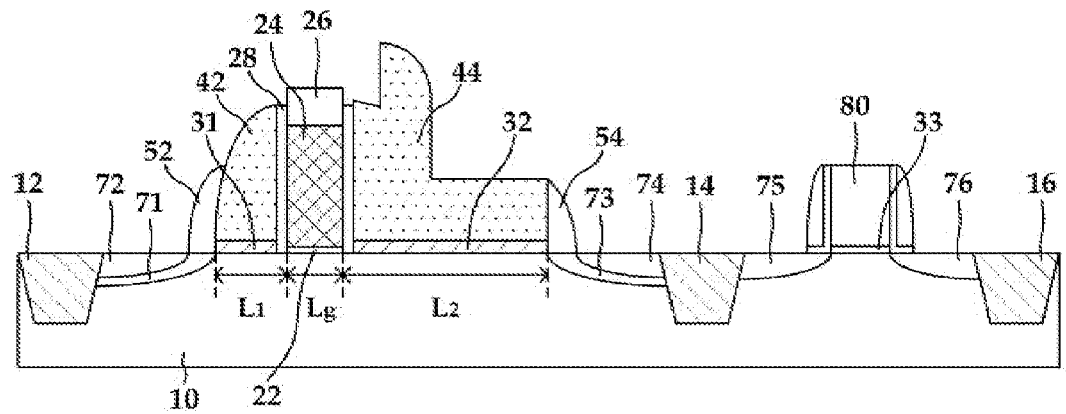
FIG. 2 is a diagram illustrating an example of a non-volatile memory device.

FIG. 2 is a diagram illustrating an example of a non-volatile memory device. FIG. 2 is a cut-away section view taken along a line X-X' in FIG. 1. A floating gate insulating layer 22 and a floating gate 24 are disposed on a substrate 10. At A dielectric layer 28 is disposed at both sides of the floating gate 24. A first control gate 42 having a first width (L1) and a second control gate 44 having a second width (L2) are disposed on either sides of the dielectric layer 28. The control gates 42, 44 may form a spacer that surrounds a side wall of the floating gate 24. The first control gate 42 and the second control gate 44 are connected with each other and the second width (L2) is wider than the first width (L1). It is preferable that the second width (L2) is not less than 1.5 times and not more than 3.5 times on the basis of a width (Lg) of the floating gate 24.

A first gate insulating layer 31 is disposed between the substrate 10 and the first control gate 42. A second control gate insulating layer 32 is disposed between the substrate 10 and the second control gate 44. The second control gate insulating layer 32 in a non-volatile memory device is extended further than the first control gate insulating layer 31. By doing so, it is possible to reduce a leakage current that flows in the substrate 10 beneath the second control gate 44.

A source region 72 is disposed at a side of the first control gate 42. A drain region 74 is disposed at a side of the second control gate 44. Dielectric isolation layers 12, 14, 16 are disposed on the substrate 10 to define a unit cell. The dielectric isolation layers 12, 14, 16 serve to electrically isolate a unit memory cell from the adjacent cell, and may be formed through a Shallow Trench Isolation (STI) process.

Spacers 52 and 54 are formed at side of the control gates 42 and 44, respectively. Drift regions 71 and 73 having low concentration or LDD regions 71 and 73 are formed beneath the spacers 52 and 54. To obtain a high breakdown voltage, the drift regions 71 and 73 are formed in a manner that surrounds the high concentration regions 72 and 74, respectively. The spacers 52 and 54 are formed in the identical process to the spacer that is formed at a side of a logic gate 80. In the region without the spacer, a silicide (not shown) may be formed at a substrate surface and a control gate surface. A logic gate insulating layer 33 is disposed between the logic gate 80 and the substrate 10.

Figure 3:
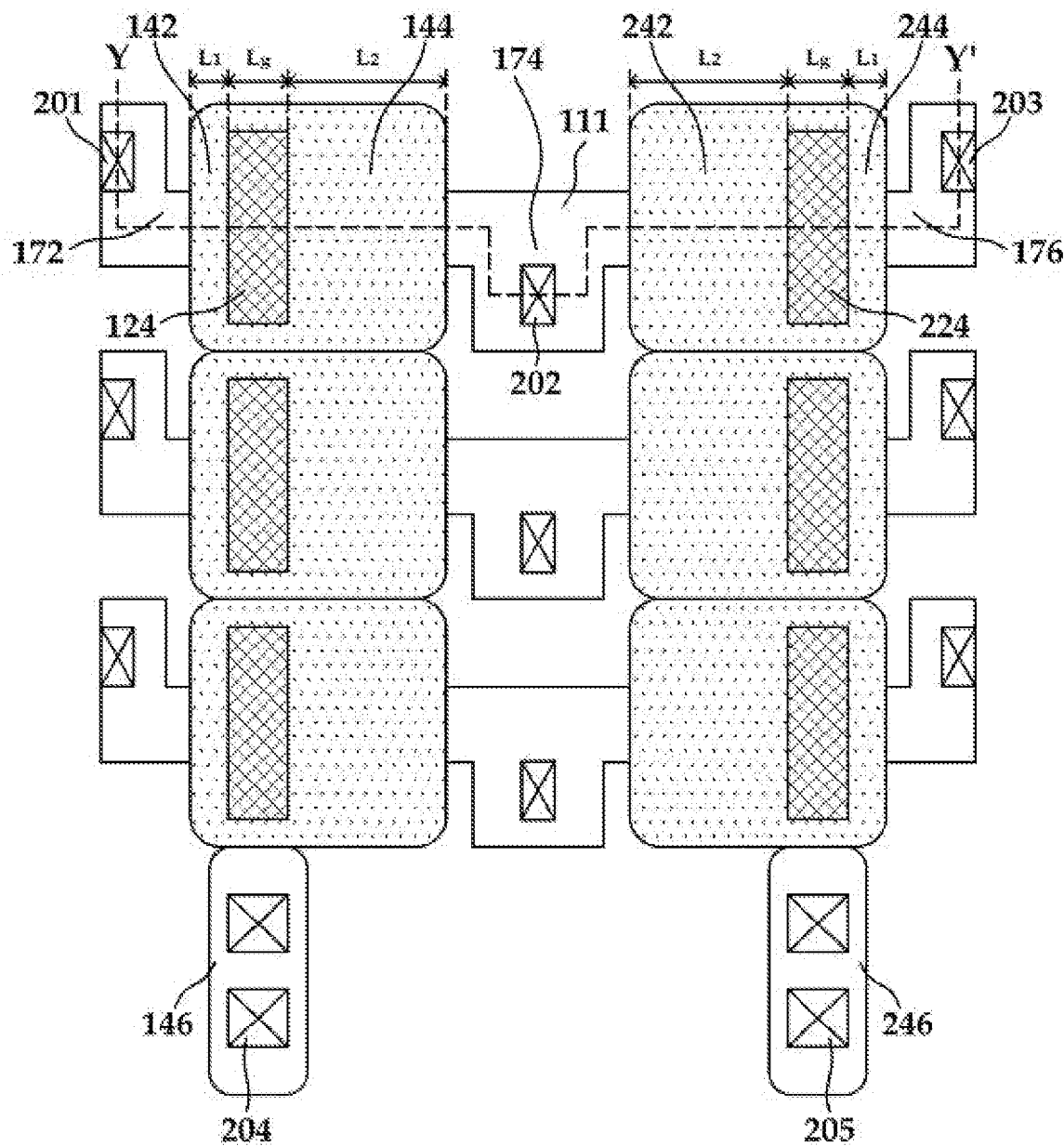
FIG. 3 is a diagram illustrating an example of a plurality of non-volatile memory devices.

FIG. 3 is a diagram illustrating an example of a plurality of non-volatile memory devices.

A plurality of non-volatile memory devices of unit cell described in FIG. 1, are formed in an aggregation unit with each other. The plurality of control gates 142, 144, 242, and 244 are electrically/physically connected with the control gates that are formed in the adjacent cell, thus, when a voltage is applied to one control gate, the voltage is applied to the control gates of all cells included in the whole cell array. When applying a voltage for a program or an erase, a voltage is applied to a control gate of all cells included in the whole cell array, if a voltage is applied to one control gate.

The explanation about FIG. 3 is similar to the aforesaid explanation about FIG. 1. Accordingly, the description of the non-volatile memory device of FIG. 1 is incorporated in the description of FIG. 3. The floating gates 124 and 224 are in the active region 111. The control gates 142, 144, 242, and 244 surround the floating gates 124 and 224. In the active region 111, source regions 172 and 176 and a drain region 174 are disposed. Contact plugs 201, 202, and 203 are disposed in the active region 111 to apply a voltage to the source regions 172 and 176 and to the drain region 174. As shown in the drawing, a control gate may be divided into a first control gate 142 and 244 and a second control gate 144 and 242, and they are connected with each other. The first control gate 142 and 244 have a first width (L1) in a direction of a channel. The second control gates 144 and 242 have a second width (L2) in a direction of a channel.

Figure 4:
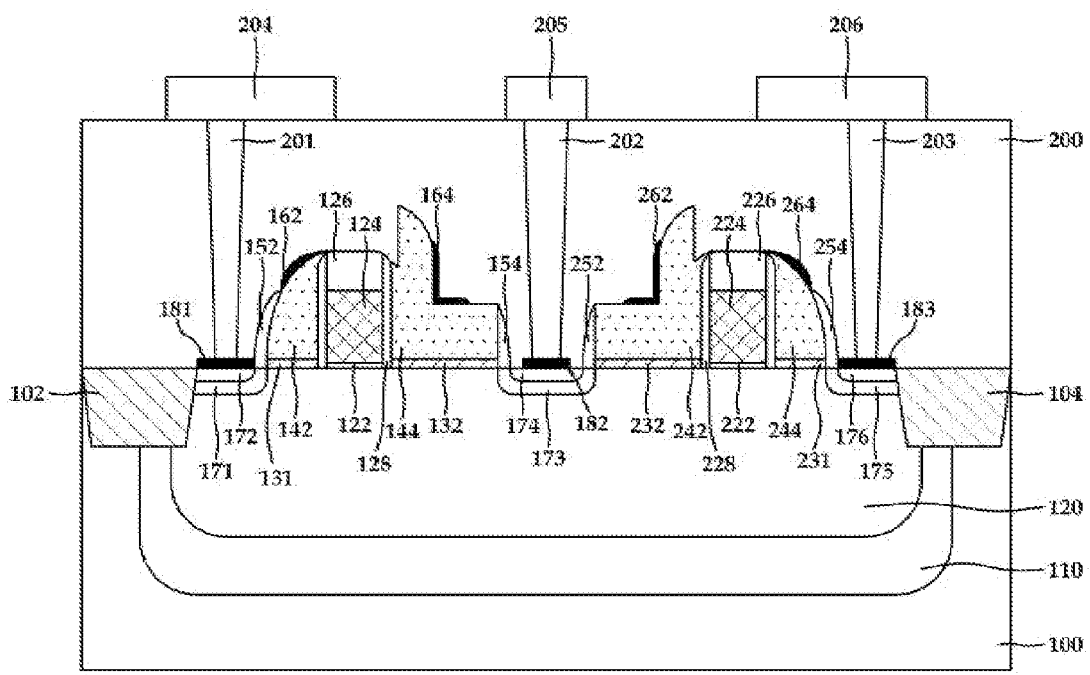
FIG. 4 is a diagram illustrating an example of a plurality of non-volatile memory devices.

As described above, the second width (L2) is longer than the first width (L1). The second control gates 144 and 242 having a longer length (L2) are opposite to each other, and a drain region 174 is formed between the second control gates 144 and 242. The drain region 174 and the source regions 172 and 176 may be interchangeable. The contact plug 202 formed on the drain region 174 and the contact plugs 201 and 203 formed on the source regions 172 and 176, respectively, are not in straight line with each other. The contact plugs are not in straight line with each other to connect wires 204, 205, and 206, as shown in FIG. 4. To apply a different voltage from each other, the wire that does not intersect each other needs to be used. The contact plug 202 formed on the drain region 174 and the contact plugs 201 and 203 formed on the source regions 172 and 176, respectively, cannot be disposed in the same straight line.

Third control gates 146 and 246 are additionally disposed, which are extended further toward the side of the plurality of control gates. Widths of the third control gates 146 and 246 are narrower than those of the second control gates 144 and 242. The contact plugs 204 and 205 are formed on the third control gates 146 and 246 to apply a voltage to the third control gates 146 and 246. The third control gates 146 and 246 are electrically/physically connected with the first and second control gates 142, 144, 242, and 244. Thus, if a voltage is applied through the contact plugs 204 and 205, a voltage is applied to the first and second control gates 142, 144, 242, and 244. The widths of third control gates 146 and 246 are at least wider than widths (Lg) of the floating gates 124 and 224 to properly form the contact plugs 204 and 205 on the surfaces of the third control gates 146 and 246, respectively.

FIG. 4 is a diagram illustrating an example of a plurality of non-volatile memory devices. FIG. 4 is a cut-away section view taken along a line Y-Y' in FIG. 3. An N-type well region 110 is formed in a P conductive type substrate 100. A P-type well region 120 is formed on the -type well region 110. The N-type well region 110 electrically separates the P-type well region 120 and P conductive type substrate 100.

As described with reference to FIG. 3, floating gate insulating layers 122 and 222 and floating gates 124 and 224 are disposed on substrate 100. Dielectric layers 128 and 228 are disposed at both sides of the floating gates 124 and 224, respectively. Control gates are disposed at the side of the dielectric layers 128 and 228, which comprises first control gates 142 and 244 having first width and second control gates 144 and 242 having second width. The control gate may form spacer that surrounds a side wall of the floating gates 124 and 224. A height of the control gate is designed to be at least higher than that of the floating gates 124 and 224. This provides a coupling effect between the control gate and the floating gate. It is advantageous as the control gate and the floating gate are more overlapped with each other.

The first control gates 142 and 244 and the second control gates 144 and 242 exit at the side of the floating gates 124 and 224, respectively. The first control gates 142 and 244 and the second control gates 144 and 242, however, do not exist at upper surfaces of the floating gates 124 and 224, i.e., a control gate is formed in the form of spacer by means of an etch-back process. The first control gates 142 and 244 and the second control gates 144 and 242 are connected with each other, and the second width (L2) is wider than the first width (L1). It is preferable that the second width (L2) is not less than 1.5 times and not more than 3.5 times of the widths (Lg) of the floating gates 124 and 224.

The first control gate insulating layers 131 and 231 are disposed between the substrate 100 and the first control gates 142 and 244, respectively. The second control gate insulating layers 132 and 232 are disposed between the substrate 100 and the second control gates 144 and 242, respectively. The second control gate insulating layers 132 and 232 in the non-volatile memory devices are extended further than the first control gate insulating layers 131 and 231, respectively. For this reason, the channel length is longer due to the second control gate insulating layers 132 and 232 that are formed to be longer, thereby reducing the leakage current.

In order to lower a contact resistance at the substrate surface, which is beneath the contact plug, silicides 181, 182, and 183 are formed. Silicides 162, 164, 262, and 264 are formed as well as at the surfaces of the first and second control gates 142, 144, 242, and 244.

FIGS. 5 to 8 are diagrams illustrating examples of a manufacturing method of a non-volatile memory device.

Figure 5:
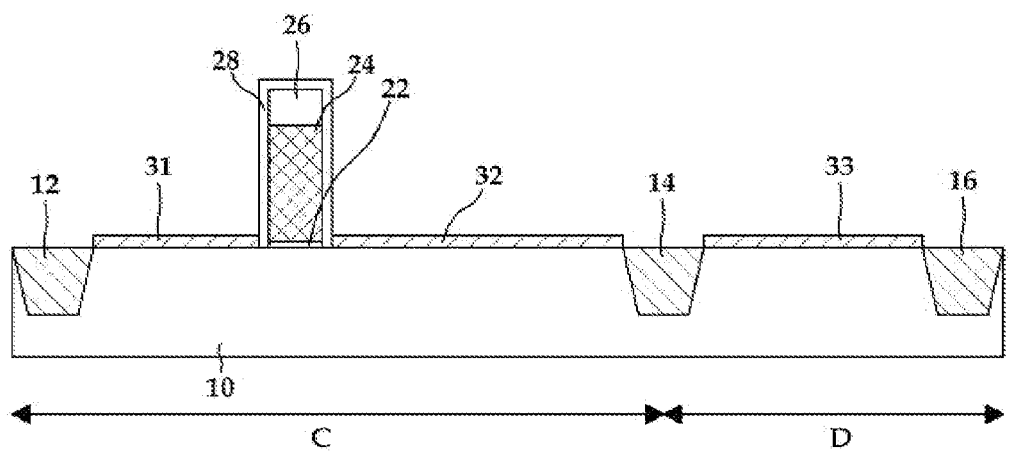
FIGS. 5 to 8 are diagrams illustrating examples of a manufacturing method of a non-volatile memory device.

Referring to FIG. 5, dielectric isolation layers 12, 14, and 16 are disposed to define a unit cell on the substrate 10. The dielectric isolation layers 12, 14, and 16 serve to electrically isolate a unit memory cell from the adjacent cell. For example, such dielectric isolation layers 12, 14, and 16 may be formed by the manner in which a trench is formed using a Shallow Trench Isolation (STI) and thereby filing an insulation material into the trench.

Subsequently, a floating gate insulating layer (22 or a Tunneling oxide layer), a conductive layer for floating gate 24 and a hard mask layer 26 are disposed in regular series, and a photolithography process is then applied.

A thickness of the floating gate insulating layer 22 may be in a range of about 70 Å~100 Å. A thickness of disposition of a conductive layer for floating gate 24 is about 1,000 Å~5,000 Å, and a polysilicon is used. The thickness of disposition of a conductive layer for floating gate 24 is an important factor that decides a coupling ratio of the floating gate 24.

The hardmask 26 may use an oxide layer or a nitride layer or a combination of the two. Its thickness is determined by a height of a floating gate 24 that will be formed at the lower part and may be disposed in the range of 500 Å~2,000 Å.

An isolation distance between the dielectric isolation layers 12, 14, and 16 may be properly controlled so as to embody a structure where a length of a control gate is extended.

The floating gate 24 is formed closer to one dielectric layer among the two dielectric isolation layers, or may be formed approximately at an intermediate position of two dielectric isolation layers 12 and 14. Preferably, the floating gate 24 is formed closer to one dielectric layer among two dielectric isolation layers 12 and 14. This is because in the photolithography process applied for extension of a control gate length, only one photosensitive pattern may be used, such that the process may be simplified and the manufacturing method may also be reduced.

A floating gate 24 is formed by etching a conductive layer for floating gate 24 using a hardmask 26. Here, the reference numeral 24 denotes a conductive layer for floating gate before the etching process and a floating gate after the etching process. A dielectric layer 28 is formed at a surface of a substrate 10, a side of a floating gate 24 and a surface of a hardmask 26. This dielectric layer 28 may be a silicon oxide layer, a silicon nitride layer, or may be a multi-layer such as a first oxide layer-second oxide layer (abbreviated as "ONO insulating layer"). In another example, instead of the silicon oxide layer, silicon nitride layer, a high dielectric layer (high-k) may be used such as, for example, HfO2, or Al2O3 may be used.

Such process is performed as to form a first control gate insulating layer 31, a second control gate insulating layer 32, and a logic gate insulating layer 33 at a surface of the substrate 10. When the dielectric layer 28 is formed into an ONO insulating layer, when disposing the last oxide layer, i.e., the second oxide layer, the first and the second control gate insulating layers 31 and 32 are formed together. A second oxide layer of ONO insulating layer and first and second control gate insulating layers 31 and 32 become the same material. Hence, the process cost may be reduced.

Figure 6:
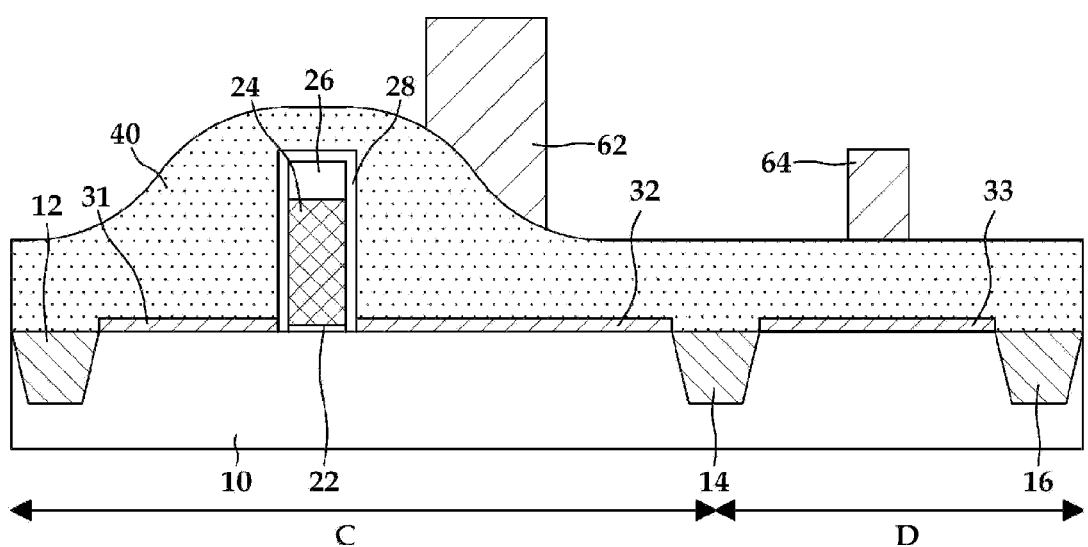

Referring next to FIG. 6, a conductive layer 40 is formed to cover an upper part and side wall of the floating gate 24 and the substrate 10. The conductive layer 40 may use a material, such as, for example, a polysilicon having the electrical conductivity. The conductive layer 40 is formed by a thickness at which the control gate and the logic gate electrode are formed. A mask pattern for a logic gate patterning 64 is formed at the logic gate region (D), and the logic gate is formed. While etching a polysilicon of the logic gate region (D), a control gate conductive layer (polysilicon) which exists in the non-volatile device region, needs to be protected by means of a mask pattern (not shown), so that it may not be etched.

After the logic gate is formed, a pattern for extension of a control gate length 62 is then formed at one side of the floating gate 24. Using this pattern for extension of control gate length 62 as a mask, the conductive layer for control gate 40 is subjected to the etch-back process thereby forming control gates 42 and 44. The pattern for extension of the control gate length 62 may be formed at a left side of the floating gate 24, at a right side of the floating gate 24, or at left and right sides of the floating gate 24.

Through a photolithography process using a pattern for extension of a control gate length 62 (PR), lengths of the control gates 42 and 44 may be extended. By controlling a length of the pattern for extension of control gate length 62, it is possible to control the lengths of the control gates 42 and 44 to a desired level. As shown in the example of FIG. 6, for ease of explanation it is assumed that the pattern for extension of the control gate length 62 (PR) is formed only at a right side of the floating gate 24.

As set forth above, in order to embody a structure where lengths of the control gates 42 and 44 are extended, an isolation distance between the dielectric isolation layers 12 and 14 are designed to be long and the floating gate 24 is formed to lean toward the left side dielectric isolation layer 12. Accordingly, a distance between the floating gate 24 and the right side dielectric isolation layer 14 is relatively longer. In the example described herein, on this region (i.e., on the conductive layer for control gate 40 that is formed between the floating gate 24 and the right side dielectric isolation layer 14), a pattern for extension of a control gate length 62 is formed.

Figure 7A:
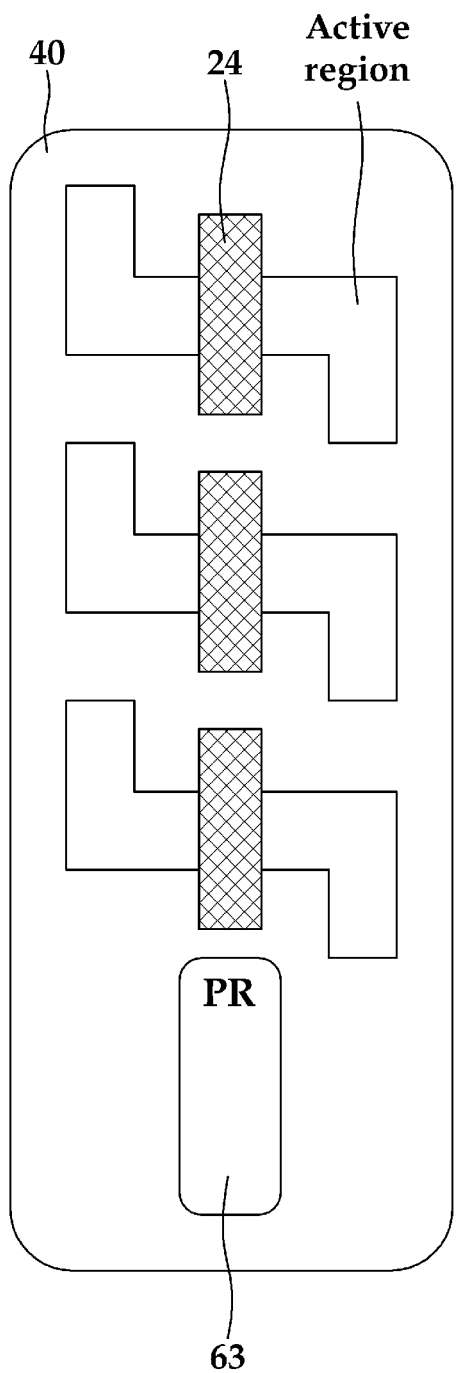
Figure 7B:
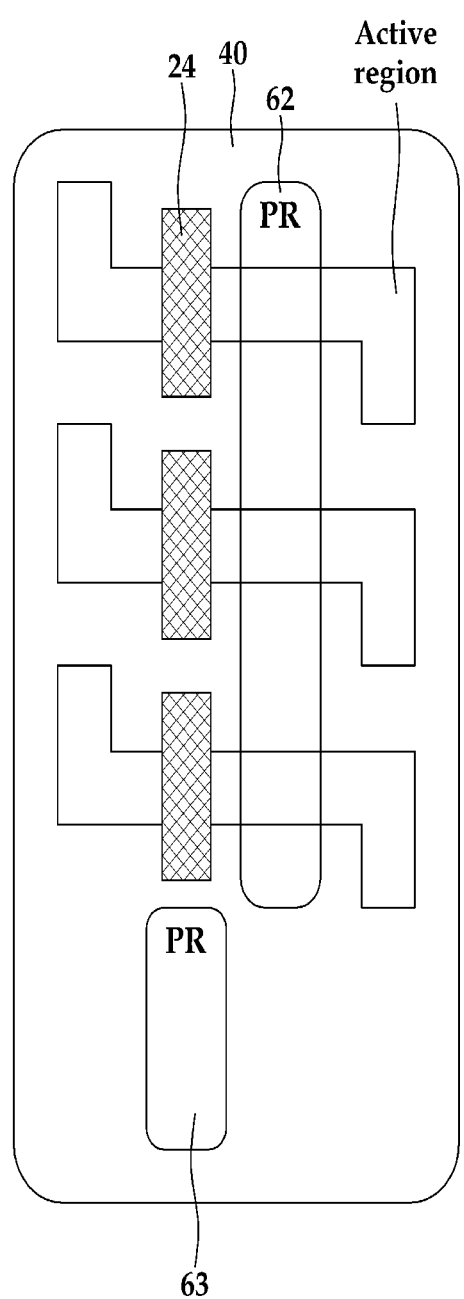

FIGS. 7A and 7B are diagrams illustrating examples of the presence or absence of the pattern for extension of control gate length 62 on the conductive layer for control gate 40. FIG. 7A is a diagram illustrating an example that is used when manufacturing a control gate shape of a usual symmetry structure. FIG. 7B is a diagram illustrating an example of a control gate shape of an asymmetrical structure. The pattern for extension of the control gate length 62 is formed on the conductive layer for control gate 40, and is disposed at one side of the floating gate 24. To form a contact at the conductive layer for control gate 40, the gate contact pattern 63 is formed together. The gate contact pattern 63 is formed to be aligned with the floating gate 24. The pattern for extension of the control gate length 62 is disposed to be parallel, in a state in which it is isolated from a side of a floating gate with a certain interval. A length of the pattern for extension of the control gate length 62 is formed to be longer at least than that of the floating gate 24.

Figure 8:
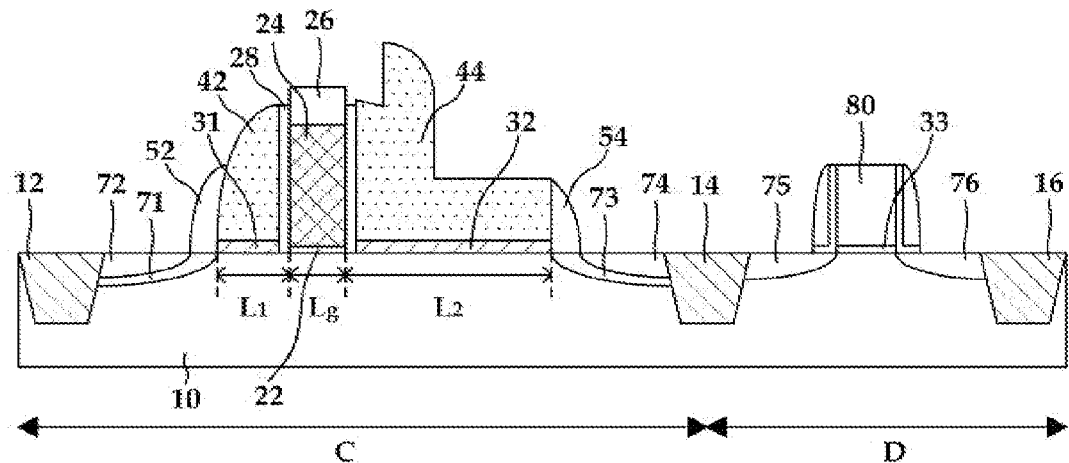

As shown in FIG. 8, using this as a mask, an etch process is performed to form asymmetric control gates 42 and 44. According to a non-exhaustive example, to control a width of the pattern for extension of the control gate length (PR), it is possible to control lengths (L1, L2) of the control gates formed lastly. Once the aforesaid processes are performed, there is provided a non-volatile memory device having a structure where a length of a control gate is extended asymmetrically in comparison with the conventional non-volatile memory devices. A length (L2) of the second control gate that is formed on one side of the floating gate 24 is bigger than a length (L1) of the first control gate and is bigger than a width (Lg) of the floating gate 24.

Low concentration drift regions 71 and 73 are then formed. And then, spacers 52 and 54 are formed. And then, high concentration source/drain regions 72, 74, 75, and 76 are formed. Thereafter, a process to form a silicide, a contact plug proceeds.

Figure 9:
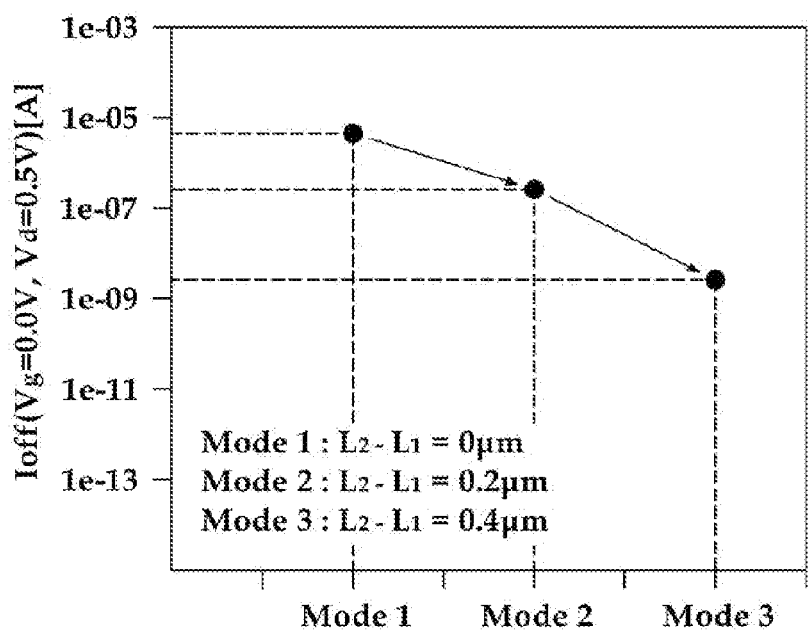
FIG. 9 is a diagram illustrating an example of measurement results of a leakage current change according to an extension of a control gate length.

FIG. 9 shows a view of measurement results of a leakage current change according to an extension of a control gate length. It may be appreciated that a leakage current is reduced as a length in a transverse direction of a control gate increases. The leakage current at this time, is a current that leaks to a substrate 10 in a case where a voltage to be applied to a control gate is 0 V, i.e., a state in which the control gate is off.

The second width (L2) is length of a second control gate 44.

The first width (L1) is a length of a first control gate 42. "L2−L1=0 um" refers to a symmetry structure characterized of L1=L2 (i.e., L1 and L2 are the same length). Rather than in L2−L1=0.2 um, the smallest leakage current is shown in cases of 0.4 um. As a length difference of L2 and L1 is rendered bigger continuously, the leakage current reduces. However, the cell sizes increases correspondingly, thereby disadvantageously increasing an extent of a chip.

Thus, it is preferable that the first control gate 42 and the second control gate 44 are connected with each other, and the second width (L2) is wider than the first width (L1) and the second width (L2) is not less than 1.5 times and not more than 3.5 times on the basis of a width (Lg) of the floating gate 24.

As set forth in detail above, according to the present disclosure, a length of a control gate of a non-volatile memory device may be easily extended at low cost, thereby effectively preventing the generation of leakage current in a state in which a control gate is off.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A non-volatile memory device, the device comprising:
   a floating gate insulating layer disposed on a substrate;
   a floating gate insulated from the substrate by the floating gate insulating layer;
   a first dielectric region formed perpendicular to the floating gate insulating layer on a first sidewall of the floating gate;
   a second dielectric region formed perpendicular to the floating gate insulating layer on a second sidewall of the floating gate;
   a first control gate at a side of the first dielectric region on the first sidewall of the floating gate distal from the floating gate; and
   a second control gate at a side of the second dielectric region on the second sidewall of the floating gate distal from the floating gate,
   wherein the first control gate and the second control gate are in contact with each other, a second width of the second control gate is wider than a first width of the first control gate, and the first width extends perpendicularly from the side of the first dielectric region in a direction that is opposite to a direction in which the second width extends from the side of the second dielectric region and is parallel to a direction of a channel.

2. The non-volatile memory device of claim 1, further comprising:
   a first control gate insulating layer formed between the substrate and the first control gate; and
   a second control gate insulating layer formed between the substrate and the second control gate,
   wherein the second control gate insulating layer extends further than the first control gate insulating layer.

3. The non-volatile memory device of claim 1,
   wherein the second width is not less than 1.5 times and not more than 3.5 times a width of the floating gate.

4. The non-volatile memory device of claim 1, further comprising:
   a source region; and
   a drain region,
   wherein the direction of the channel extends from the source region to the drain region.

5. The non-volatile memory device of claim 1, further comprising:
   a third control gate extending toward a side of the first or the second control gates.

6. The non-volatile memory device of claim 5,
   wherein a width of the third control gate is narrower than a sum of the width of the first and the second control gates.

7. The non-volatile memory device of claim 5, further comprising:
   a contact plug formed on the third control gate.

8. A method of manufacturing a non-volatile memory device of claim 1, the method comprising:
   forming the floating gate insulating layer and the floating gate disposed on the substrate;
   forming a dielectric layer perpendicular to the floating gate insulating layer and at two sides of the floating gate to form the first dielectric region and the second dielectric region;
   forming a control gate insulating layer on the substrate;
   forming a conductive layer on the dielectric layer and the control gate insulating layer;
   forming a control gate pattern at a portion of the conductive layer;
   etching-back the control gate using the control gate pattern as a mask; and
   forming the first control gate at the side of the first dielectric region distal from the floating gate and the second control gate at the side of the second dielectric region distal from the floating gate.

9. The method of manufacturing non-volatile memory device of claim 8,
   wherein the control gate insulating layer comprises:
   a first control gate insulating layer formed between the substrate and the first control gate; and
   a second control gate insulating layer formed between the substrate and the second control gate,
   wherein the second control gate insulating layer is formed to extend further than the first control gate insulating layer.

10. The method of manufacturing non-volatile memory device of claim 8, wherein a width of the second control gate is not less than 1.5 times and not more than 3.5 times a width of the floating gate.

11. The method of manufacturing non-volatile memory device of claim 8,
wherein a length of the control gate is controlled by controlling a width of the control gate pattern.

12. The method of manufacturing non-volatile memory device of claim 8,
wherein the etching-back of the control gate comprises forming a third control gate extending toward a side of the first or the second control gates.

13. The method of manufacturing non-volatile memory device of claim 12, further comprising:
forming a contact plug on the third control gate.

14. The non-volatile memory device of claim 1, further comprising:
a first channel formed under the first control gate; and
a second channel formed under the second control gate, wherein a length of the second channel is greater than a length of the first channel.

15. The non-volatile memory device of claim 14, further comprising:
a first control gate insulating layer formed between the substrate and the first control gate; and
a second control gate insulating layer formed between the substrate and the second control gate.

16. A non-volatile memory device, the device comprising:
a floating gate insulating layer disposed on a substrate;
a floating gate insulated for the substrate by the floating gate insulating layer;
a first dielectric region formed on a first vertical sidewall of the floating gate;
a second dielectric region formed on a second vertical sidewall of the floating gate;
a first control gate positioned adjacent to a side of the first dielectric region on the first sidewall of the floating gate; and
a second control gate positioned adjacent to a side of the second dielectric region on the second sidewall of the floating gate,
wherein the first control gate and the second control gate are in contact with each other to surround the floating gate, and a width of the first control gate extending perpendicularly from the side of the first dielectric region and a width of the second control gate extending perpendicularly from the side of the second dielectric region are asymmetrical to each other and are parallel to a direction of a channel.

17. The non-volatile memory device of claim 16, further comprising:
a source region disposed adjacent to the first control gate and a drain region disposed adjacent to the second control gate; and
a first contact plug supplying voltage to the source region and a second contact plug supplying voltage to the drain region.

18. The non-volatile memory device of claim 16, wherein a second width of the second control gate is wider than a first width of the first control gate, and the second width is not less than 1.5 times and not more than 3.5 times a width of the floating gate.

19. The non-volatile memory device of claim 16, further comprising:

spacers disposed adjacent to the first control gate and the second control gate and the spacers being distal from the floating gate; and
drift regions having low concentration being formed beneath the spacers.

20. The non-volatile memory device of claim 16 wherein, the floating gate comprises a conductive layer and a hard mask layer disposed in series on the floating gate insulating layer.

21. The non-volatile memory device of claim 16, further comprising:
a first channel formed under the first control gate; and
a second channel formed under the second control gate, wherein a length of the second channel is greater than a length of the first channel.

22. The non-volatile memory device of claim 21, further comprising:
a first control gate insulating layer formed between the substrate and the first control gate; and
a second control gate insulating layer formed between the substrate and the second control gate.

23. A non-volatile memory device, the device comprising:
a floating gate insulating layer disposed on a substrate;
a single floating gate insulated from the substrate by the floating gate insulating layer and comprising a first sidewall and a second sidewall opposite to the first sidewall;
a first dielectric region formed on the first sidewall of the floating gate;
a second dielectric region formed on the second sidewall of the floating gate;
a first control gate at a side of the first dielectric region on the first sidewall of the floating gate; and
a second control gate at a side of the second dielectric region on the second sidewall of the floating gate,
wherein the first control gate and the second control gate are in contact with each other, a second width of the second control gate is wider than a first width of the first control gate, and the first width extends perpendicularly from the side of the first dielectric region in a direction that is opposite to a direction in which the second width extends from the side of the second dielectric region and is parallel to a direction of a channel.

24. The non-volatile memory device of claim 23, further comprising:
a first control gate insulating layer formed between the substrate and the first control gate; and
a second control gate insulating layer formed between the substrate and the second control gate,
wherein the second control gate insulating layer extends further than the first control gate insulating layer.

25. The non-volatile memory device of claim 23, further comprising:
a first channel formed under the first control gate; and
a second channel formed under the second control gate, wherein a length of the second channel is greater than a length of the first channel.

26. The non-volatile memory device of claim 25, further comprising:
a first control gate insulating layer formed between the substrate and the first control gate; and
a second control gate insulating layer formed between the substrate and the second control gate.

* * * * *